US009608567B2

(12) United States Patent
Egard et al.

(10) Patent No.: US 9,608,567 B2
(45) Date of Patent: Mar. 28, 2017

(54) TRANSCEIVER MODULE (75) Inventors: Mikael Egard, Lund (SE); Mats Ärlelid, Malmö (SE); Lars-Erik Wernersson, Lund (SE)

(73) Assignee: Acconeer AB, Lund (SE)

( * ) Notice: Subject to any disclaimer, the term of this patent is extended or adjusted under 35 U.S.C. 154(b) by 108 days.

(21) Appl. No.: 14/123,004

(22) PCT Filed: May 30, 2011

(86) PCT No.: PCT/EP2011/058847
§ 371 (c)(1),
(2), (4) Date: Dec. 20, 2013

(87) PCT Pub. No.: WO2012/163403
PCT Pub. Date: Dec. 6, 2012

(65) Prior Publication Data
US 2014/0098845 A1  Apr. 10, 2014

(51) Int. Cl.
*H04B 1/38* (2015.01)
*H03B 7/08* (2006.01)
*H04B 1/7163* (2011.01)

(52) U.S. Cl.
CPC ............... *H03B 7/08* (2013.01); *H04B 1/38* (2013.01); *H03B 2200/0046* (2013.01); *H04B 1/7163* (2013.01)

(58) Field of Classification Search
CPC .............................. H04B 1/38; H04B 1/7163
USPC ........................................................... 455/73
See application file for complete search history.

(56) References Cited

U.S. PATENT DOCUMENTS

| 3,237,123 | A |   | 2/1966 | Watters |
|---|---|---|---|---|
| 5,883,549 | A |   | 3/1999 | De Los Santos |
| 6,020,757 | A | * | 2/2000 | Jenkins, IV ..... H03K 19/01858 326/16 |
| 6,316,965 | B1 |   | 11/2001 | Jonker |
| 6,724,269 | B2 |   | 4/2004 | Joe |
| 6,864,816 | B1 | * | 3/2005 | Frazier ................... B82Y 10/00 326/134 |

(Continued)

FOREIGN PATENT DOCUMENTS

| JP | 41-11970 Y | 6/1966 |
|---|---|---|
| JP | 1-303814 A | 12/1989 |

(Continued)

OTHER PUBLICATIONS

Ärlelid, M., et al., "A 60 GHz Super-Regenerative Oscillator for Implementation in an Impulse Radio Receiver," IEEE International Conference on Ultra-Wideband (ICUWB 2010), Nanjing, China, Sep. 20-23, 2010, pp. 1-4.

(Continued)

*Primary Examiner* — Wesley Kim
*Assistant Examiner* — Raj Chakraborty
(74) *Attorney, Agent, or Firm* — Christensen O'Connor Johnson Kindness PLLC (57) ABSTRACT A transceiver comprising a tank circuit, a variable differential conductance, VDC, coupled to the tank circuit, and a variable resistance coupled to the VDC is disclosed. The variable resistance is arranged to bias the VDC into a region of positive differential conductance during a first state of operation of the transceiver, and bias the VDC into a region of negative differential conductance during a second state of operation of the transceiver.

14 Claims, 8 Drawing Sheets

(56) References Cited

U.S. PATENT DOCUMENTS

| | | | |
|---|---|---|---|
| 6,993,315 B1 | 1/2006 | Frazier | |
| 2008/0037316 A1* | 2/2008 | Vega | G11C 11/38 365/159 |
| 2009/0102571 A1* | 4/2009 | Park | H03F 1/223 331/108 C |

FOREIGN PATENT DOCUMENTS

| | | |
|---|---|---|
| JP | 4-240924 A | 8/1992 |
| JP | 2005-333227 A | 12/2005 |
| JP | 2011-61274 A | 3/2011 |
| WO | 2011/027672 A1 | 3/2011 |

OTHER PUBLICATIONS

Ärlelid, M., et al., "60 GHz Ultra-Wideband Impulse Radio Transmitter," IEEE International Conference on Ultra-Wideband (ICUWB 2009), Vancouver, Canada, Sep. 9-11, 2009, pp. 185-188.

Ärlelid, M., et al., "Coherent V-Band Pulse Generator for Impulse Radio BPSK," IEEE Microwave and Wireless Components Letters 20(7):414-416, Jul. 2010.

Buccafurri, E., et al., "Challenges and Prospects of RF Oscillators Using Silicon Resonant Tunneling Diodes," Proceedings of ESSCIRC (ESSCIRC '09), Athens, Sep. 14-18, 2009, pp. 220-223.

Choi, S., et al., "Experimental Study on Temperature Dependence of RTD-Based Low-Power MMIC VCO," IEEE International Conference on Indium Phosphide & Related Materials (IPRM '09), Newport Beach, Calif., May 10-14, 2009, pp. 302-304.

De Los Santos, H.J., et al., "An Efficient HBT/RTD Oscillator for Wireless Applications," IEEE Microwave and Wireless Components Letters 11(5):193-195, May 2001.

Lind, E., et al., "Resonant Tunneling Permeable Base Transistor Based Pulsed Oscillator," Device Research Conference (62nd DRC) Conference Digest, Notre Dame, Ind., Jun. 21-23, 2004, vol. 1, pp. 129-130.

Matiss, A., et al., "Sub-Nanosecond Pulse Generation Using Resonant Tunneling Diodes for Impulse Radio," IEEE International Conference on Ultra-Wideband (ICUWB 2007), Singapore, Sep. 24-26, 2007, pp. 354-359.

Muramatsu, N., et al., "A Novel Oscillation Circuit Using a Resonant-Tunneling Diode," IEEE International Symposium on Circuits and Systems (ISCAS 2005), Kobe, Japan, May 23-26, 2005, vol. 3, pp. 2341-2344.

Wernersson, L.-E., et al., "Nanoelectronic Pulse Generators Based on Gated Resonant Tunnelling Diodes," International Journal of Circuit Theory and Applications 32(5):431-437, Sep./Oct. 2004.

Wernersson, L.-E., et al., "Ultra Wideband Transmitter and Receiver," Swedish Application No. 0700531-7, filed Feb. 27, 2007, 23 pages.

International Search Report and Written Opinion mailed Feb. 23, 2012, issued in International Application No. PCT/EP2011/058847, filed May 30, 2011, 8 pages.

International Preliminary Report on Patentability mailed Jul. 15, 2013, issued in International Application No. PCT/EP2011/058847, filed May 30, 2011, 5 pages.

Communication Pursuant to Article 94(3) EPC mailed Apr. 29, 2015, issued in corresponding European Patent Application No. 11 722 437.8, filed May 30, 2011, 6 pages.

Notice of Reasons for Rejection mailed Jun. 9, 2015, issued in corresponding Japanese Patent Application No. 2014-513055, filed May 30, 2011, 6 pages.

* cited by examiner

TRANSCEIVER MODULE

TECHNICAL FIELD

The present invention generally relates to a device and method for generating and detecting short bursts of radio frequency signals, also known as wavelets. In a specific embodiment the present invention relates to a transceiver comprising an oscillator circuit based on a negative differential conductance (NDC) element implemented by means of one or several resonant tunneling diodes (RTDs).

BACKGROUND OF THE INVENTION

Ultra wideband (UWB) systems have been developed to increase the bit-rate in wireless communication systems or, alternatively, to reduce the peak spectral power of the transmitted signals. In UWB systems the signal is transmitted as short pulses over a wide range of frequencies. As an example the pulse width should either be 15% of the carrier frequency, or, alternatively, have an absolute band width of 500 MHz. Typically the pulses should have a sufficiently low peak spectral power level that they do not interfere with other wireless techniques.

In such systems, some sort of oscillator is normally employed in order to generate the high frequency carrier signal. Depending on the specific application, different oscillator topologies, such as Dynatron, Hartley or Colpitt, Armstrong, Clapp, Wien bridge, relaxation or modifications thereof, may be used.

Irrespective of the topology used for the oscillator, the main operating principle is to keep a tank circuit, e.g. an LC circuit or any other combination of reactive elements, oscillating during a period of interest, which may be a longer continuous time period as in the case of radio broadcasts, or intermittent short time periods (wavelets) as in the case of e.g. impulse radio communications. As is well known, a tank circuit, or the oscillator as a whole, includes losses which are normally represented in the circuit in the form of one or more resistive elements. This implies that energy which is transferred back and forth between the reactive elements in the tank circuit will be dissipated in the resistive elements and the oscillation will eventually decay.

In order to sustain oscillation in the tank circuit, the losses need to be compensated for in some way. One way of providing sustained oscillation is to implement the oscillator as an amplifier which is provided with a positive feedback loop at the frequency of interest. Oscillation will in such a circuit be sustained as long as the so called Barkhausen criterion is fulfilled.

Another approach to provide a sustained oscillation in a tank circuit is to include a negative differential conductance (NDC) in the circuit in order to compensate for the inevitable losses present in the circuit. The NDC may be implemented in many different ways. For low frequency applications (<1 MHz) the NDC may e.g. be realized by means of an operational amplifier with a positive feedback loop. For high-frequency applications (>1 GHz) better performance is normally obtained by implementing the NDC in the form of a correctly biased resonant tunnel diode (RTD).

Figure 1:
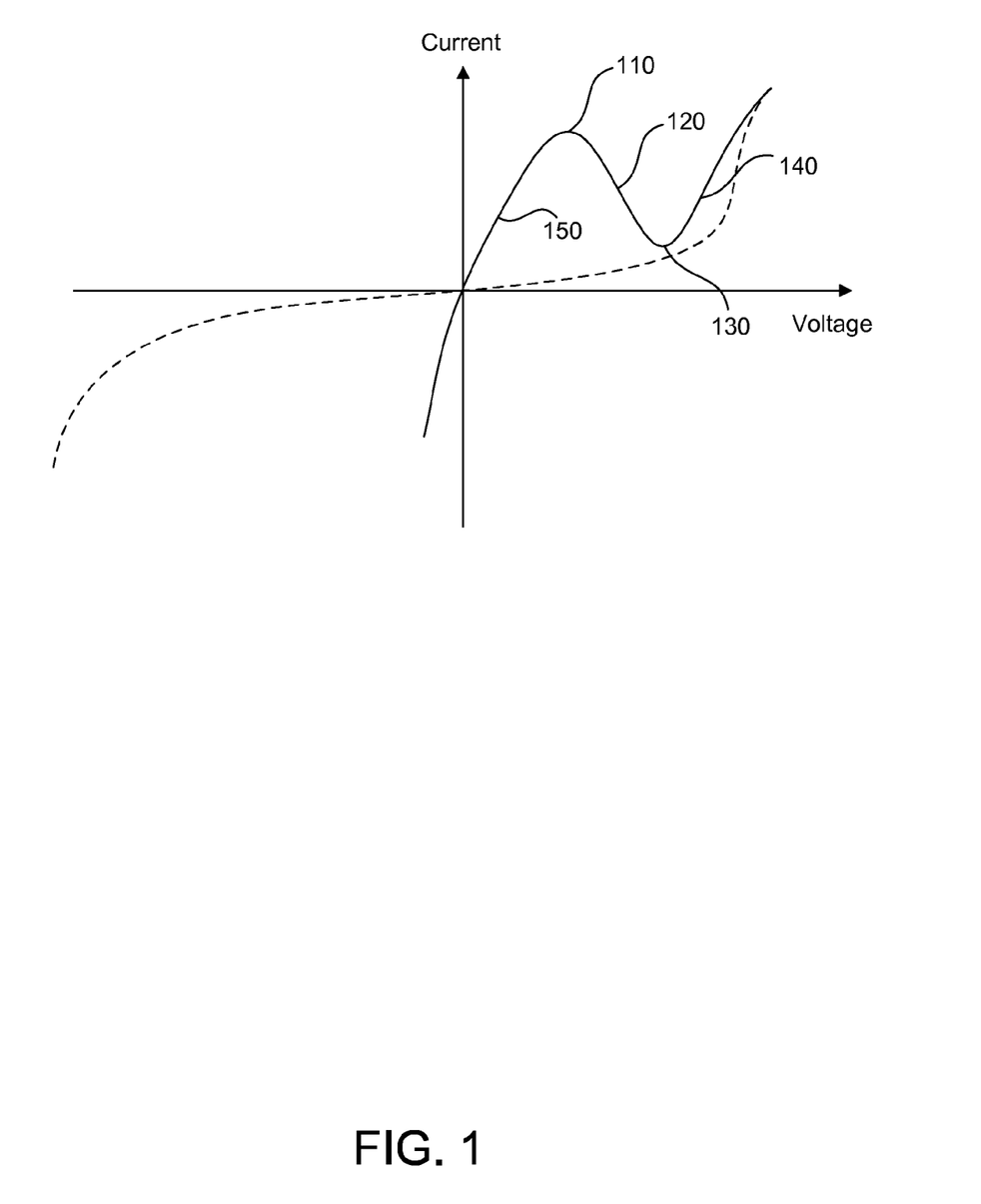
FIG. 1 diagrammatically illustrates an example of a characteristic curve of a tunnel diode compared to that of a standard PN junction

To increase the understanding of the latter approach, FIG. 1 illustrates an example of a characteristic curve of an RTD compared to that of a standard PN junction diode.

In the standard PN junction diode conduction occurs only if the voltage applied to its terminals is large enough to overcome the potential barrier of the PN junction. Thus, the current-voltage characteristics of the standard PN junction diode exhibits a positive resistance/conductance irrespective of the biasing voltage applied as indicated by the dashed curve in FIG. 1.

On the other hand, an RTD exhibits an unusual current-voltage characteristics as compared with that of an ordinary PN junction diode. The characteristic curve for an RTD is indicated by the solid line in FIG. 1. The three most important aspects of this curve are i) that the forward current initially increases 150 to a local maximum (peak) 110 as the forward bias voltage increases from zero volts, ii) that the forward current, after passing the local maximum 110, decreases 120 to a local minimum (valley) 130 as the forward bias voltage increases, and finally iii) that the forward current once again, after passing the local minimum 130, increases 140 as the forward bias voltage increases. Thus, as can be inferred from FIG. 1, the RTD exhibit a negative differential conductance at the portion 120 of the characteristic curve when the current decreases with an increasing forward bias voltage. Similarly, the RTD exhibit a positive differential resistance at the portions 140, 150 of the characteristic curve when the current increases with an increasing forward bias voltage.

As mentioned above, in UWB systems the signal is transmitted as short pulses (wavelets). To this end it is desirable to control the magnitude of the NDC thereby enabling an oscillation signal to be provided to a radiating element during a desired time period (i.e. for the duration of the short pulses).

Prior art solutions for providing short high-frequency pulses have been provided in which a gated tunnel diode is formed by the embedding of a metal gate in the direct vicinity of a double barrier resonant tunnel diode. The NDC of the gated tunnel diode is in accordance with the disclosure above used to compensate for the losses in the tank circuit (or in the oscillator circuit as a whole) and hence provide a sustained oscillation in the tank circuit. The bias applied to the gate controls the magnitude of the NDC in the circuit and may be used to turn the oscillator on and off.

Even though the gated tunnel diode may be used for providing wavelets, the internal gating required in the gated tunnel diode induces constraints with respect to the flexibility in wavelet generation. Additionally, the diode current through a gated tunnel diode cannot be turned off completely even when the gate is set to a very negative value.

Thus, a more efficient and flexible solution for providing wavelets is desired.

SUMMARY OF THE INVENTION

According to a first aspect, the present invention is realized by a transceiver comprising: a tank circuit, a variable differential conductance (VDC), preferably in the form of a resonant tunneling diode (RTD), coupled to the tank circuit, and a variable resistance coupled to the VDC and arranged to bias the VDC into a region of positive differential conductance during a first state of operation of the transceiver, and bias the VDC into a region of negative differential conductance during a second state of operation of the transceiver.

An advantage with this embodiment is that short pulses may easily be generated by simply controlling the magnitude of the variable resistance. Additionally, no internal gate needs to be implemented in the VDC.

The variable resistance may be coupled in parallel to the VDC.

An advantage with this embodiment is that the current through the VDC, and hence the state of the oscillator (oscillating or non-oscillating) may be controlled very rapidly without complex circuitry.

The variable resistance may be coupled in series with the VDC.

An advantage with this embodiment is that the current through the VDC, and hence the state of the oscillator (oscillating or non-oscillating) may be controlled very rapidly without complex circuitry The variable resistance may be arranged to be controlled by an electrical trigger signal for moving the transceiver between the first state of operation and the second state of operation.

An advantage with this embodiment is that the state of the oscillator may easily be controlled by means of external electrical circuitry coupled to the variable resistor thereby avoiding coupling of additional circuitry to the tank circuit.

The variable resistance may be adapted to be controlled by an electrical trigger signal with a first slew rate for operating the transceiver in transmitter mode, and adapted to be controlled by an electrical trigger signal with a second, lower slew rate for operating the transceiver in receiver mode.

An advantage with this embodiment is that the transceiver may be used as both transmitter and receiver by means of the same circuitry.

The variable resistance, the VDC and the tank circuit may be integrated on a single chip.

An advantage with this embodiment is that the transceiver may be manufactured as a very compact unit.

The variable resistance may be formed by a transistor with an isolated gate, such as a MOSFET.

An advantage with this embodiment is that the power consumption of the transceiver may be reduced due to very low leakage currents in the MOSFET and also due to the very low channel resistance when the MOSFET is in an on-state. Additionally, the MOSFET has an isolated gate, which simplifies the load as seen by the circuitry controlling the variable resistance.

The transceiver may comprise a second variable resistance coupled in parallel to the VDC and arranged to shunt current from the VDC in the first state of operation, or coupled in series with the VDC and arranged to limit current in the VDC in the first state of operation.

An advantage with this embodiment is that the current through the VDC, and hence the state of the oscillator (oscillating or non-oscillating) may be controlled very rapidly due to both the short circuiting of the VDC by means of the variable parallel resistance and the increased resistance in the circuit by means of the variable serial resistance The VDC may be coupled to the tank circuit such that the positive differential conductance of the VDC during the first state of operation of the transceiver prevents the tank circuit from oscillating, and the negative differential conductance of the VDC during the second state of operation of the transceiver allows the tank circuit to oscillate.

An advantage with this embodiment is that the state of the VDC controls whether or not to sustain oscillation in the tank circuit.

According to a second aspect of the invention, the present invention is realized by a method of operating a transceiver including a tank circuit and variable differential conductance (VDC), preferably in the form of a resonant tunneling diode (RTD), coupled to the tank circuit, said method comprising: biasing the VDC into a region of positive differential conductance during a first state of operation of the transceiver and biasing the VDC into a region of negative differential conductance during a second state of operation of the transceiver by means of a variable resistance.

The variable resistance may be coupled in parallel to the VDC and shunt current from the VDC in the first state of operation.

The variable resistance may be coupled in series with the VDC and limit the current flowing through the VDC in the first state of operation.

An electrical trigger signal may be received at the variable resistance causing the transceiver to move between the first state of operation and the second state of operation.

An electrical trigger signal with a first slew rate may be received at the variable resistance causing the transceiver to operate in transmitter mode, or an electrical trigger signal with a second, lower slew rate may be received at the variable resistance for operating the transceiver in receiver mode.

Current may be shunted from the VDC in the first state of operation by means of a second variable resistance coupled in parallel to the VDC, or current may be limited in the VDC in the first state of operation by means of a second resistance coupled in series with the VDC.

Other objectives, features and advantages of the present invention will appear from the following detailed disclosure, from the attached claims as well as from the drawings.

Generally, all terms used in the claims are to be interpreted according to their ordinary meaning in the technical field, unless explicitly defined otherwise herein. All references to "a/an/the [element, device, component, means, step, etc]" are to be interpreted openly as referring to at least one instance of said element, device, component, means, step, etc., unless explicitly stated otherwise. The steps of any method disclosed herein do not have to be performed in the exact order disclosed, unless explicitly stated.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings, where the same reference numerals will be used for similar elements, wherein.

DETAILED DESCRIPTION OF PREFERRED EMBODIMENTS

Figure 2:
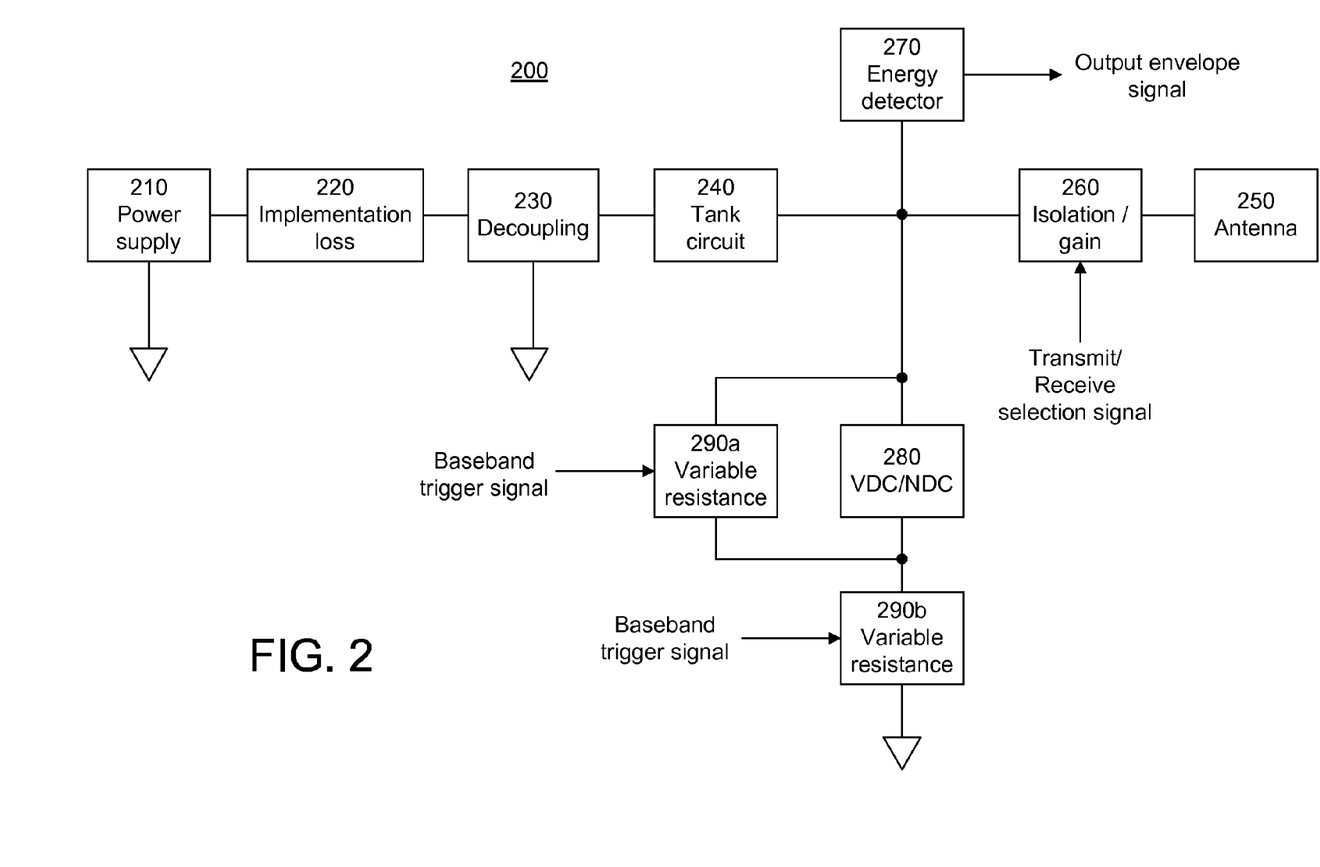
FIG. 2 is a schematic block diagram of a transceiver according to a preferred embodiment.

FIG. 2 illustrates a schematic overview of a transceiver 200 according to a preferred embodiment.

The transceiver 200 is energized by means of a power supply 210. The power supply circuitry may be integrated on the same chip as the other parts of the transceiver or may be provided as a separate part that is connected to the transceiver. The supply voltage provided by the power supply 210 is preferably a DC voltage in the range 0.2 V to 1.5 V, but a higher supply voltage such as 3, 5, 9 or 12 volts are equally possible depending on the specific application and the selection of components to use in the transceiver. The power supply 210 includes all the necessary circuitry for providing a regulated DC voltage. In an alternative embodiment the power supply 210 may be in the form of one or more batteries, and if necessary, any additional electronic circuitry for providing a regulated DC voltage.

In FIG. 2 the implementation loss 220 of the transceiver 200 represents mainly the losses present due to the wiring from the power supply and the bonding of the wiring to the rest of the circuitry. In a preferred embodiment, all or substantially all components of the transceiver are integrated on a single chip, wherein the main contribution to the implementation loss 220 arises from the bonding of the wires to the chip. Depending on the method of integration the implementation loss 220 may be more or less prominent.

In order to provide a stable voltage to the oscillator circuitry irrespective of the implementation loss 220, the transceiver includes a decoupling block 230. The decoupling block 230 operates both as a charge buffer and signal short circuit to ground thereby minimizing the effects of the impedances present in the implementation loss 220 and the power supply 210.

Referring to the general discussion above regarding different oscillator topologies, the transceiver includes a tank circuit 240 in order to provide an oscillating signal. The components of the tank circuit 240 mainly determine the oscillator frequency, but the loading of the tank circuit 240 also affects the resonance frequency. Thus, when designing the transceiver 200 all loading effects from the other components in the circuit have to be accounted for in order to determine a correct oscillator frequency. As mentioned above, the tank circuit 240 also includes losses which would cause the oscillation to decay should no energy be provided to the circuit.

The transceiver preferably includes an antenna 250. The antenna 250 improves the range of the transceiver 200 compared to leaving the tank circuit 240 to also act as a radiating/receiving element.

In one embodiment the transceiver 200 may include an isolation/gain block 260. The isolation/gain block 260 amplifies the signal received by the antenna 250 when the transceiver 200 operates in receiver mode and acts as low impedance switch when the transceiver 200 operates in transmitter mode. Alternatively the isolation/gain block 260 may also include a power amplifier in order to amplify the signal to be transmitted by the antenna when the transceiver operates in transmitter mode. If used, the isolation/gain block 260 isolates the antenna 250 from the tank circuit 240 thereby minimizing the loading on the tank circuit 240.

When the transceiver 200 operates in receiver mode an energy detector 270 operates to detect variations in the amplitude of the received signal and provide the variations as an output signal. The energy detector 270 is designed to have a high input impedance in order to minimize its loading effects on the tank circuit 240.

In order to provide a sustained oscillation the transceiver 200 includes a variable differential conductance element (VDC) which, depending on the bias applied to the VDC, operates either as a positive differential conductance (PDC) or a negative differential conductance element (NDC) 280. In the following text focus will be on when the VDC is biased into operation as an NDC 280, wherein it will compensate for the losses primarily in the tank circuit 240 but also for the losses in the oscillator circuitry as a whole.

The current through the NDC 280 may be controlled by a first variable resistance 290a coupled in parallel to the NDC. If the variable resistance 290a exhibit a resistance that is much higher than the resistance of the NDC 280 it will not affect the function of the NDC, wherein the negative resistance (or inversely the negative conductance) of the NDC will compensate for the losses in the in the tank circuit 240. However, if the resistance of the variable resistance 290a is lowered, e.g. the variable resistance 290a acts as a short circuit, the NDC 280 will be shorted and, if implemented e.g. by means of an RTD, be biased out of the region of negative resistance. A sustained oscillation is hence provided as long as the transceiver 200 is energized by the power supply 210 and the variable resistance 290a has a resistance value substantially higher than that of the NDC 280.

Alternatively, or additionally, the current through the NDC 280 (and the resistive loss in the oscillating circuit) may be controlled by a second variable resistance 290b coupled in series with the NDC 280. If the resistance of the variable resistance 290b is low, the NDC will be biased into its region of negative differential conductance, and the negative resistance of the NDC 280 will compensate for both the losses in the circuit as well as for the resistance of the variable resistance 290b, and oscillation in the tank circuit 240 will be sustained. In other words, to sustain oscillation, the sum of the losses in the circuit, the NDC 280 and the variable resistance 290b shall be equal to or below zero. If the resistance of the variable resistance 290b is increased such that the NDC 280 is biased out of its region of negative differential conductance the total resistance in the circuit will be above zero, and the oscillation will decay due to the dissipation of energy in the variable resistance 290b.

In one embodiment the NDC 280 is implemented with one or several RTDs, Esaki diodes or Gunn diodes, which may operate at a peak current density of 10 kA/cm$^2$ or more. The RTD may be implemented using many different types of materials, such as III-V, IV or II-VI semiconductor, and using different types of resonant tunneling structures, such as a heavily doped PN junction as in an Esaki diode, double barrier junction, triple barrier junction, quantum well, quantum wire or quantum dot.

As disclosed above, by biasing the RTD into its region between the local current maximum 110 and local current minimum 130, the RTD 310 exhibits negative differential conductance.

Figure 3A:
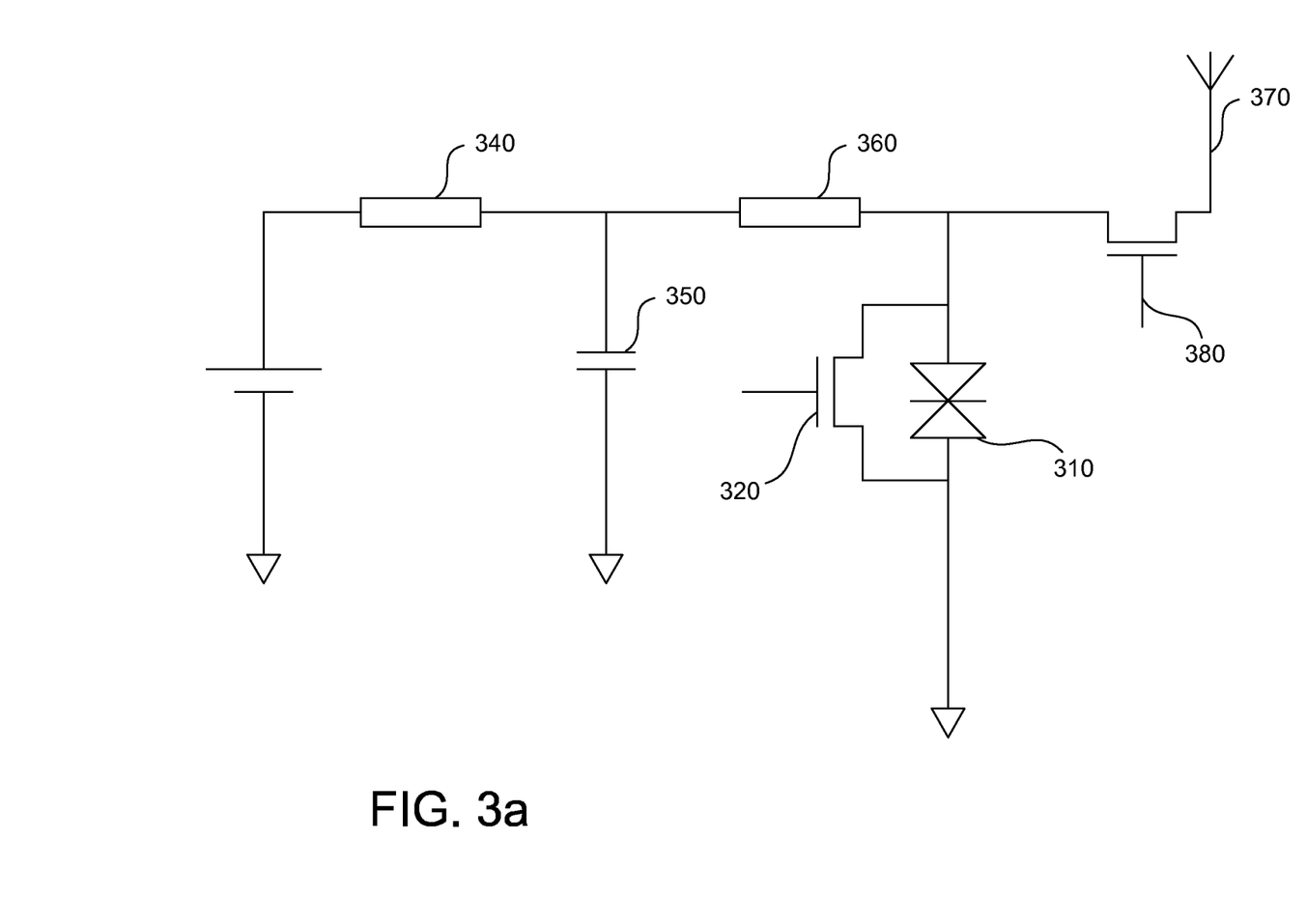
FIGS. 3a-c are schematic circuit diagrams of a transceiver according to a first embodiment.

With reference to FIG. 3a, in one embodiment the current through the RTD 310 is controlled by a variable resistance 320 that is placed parallel to the RTD 310. As disclosed above in relation to FIGS. 1 and 2, the variable resistance operates as to bias the RTD 310 between the regions of positive resistance 140, 150 and negative resistance 120.

Figure 3B:
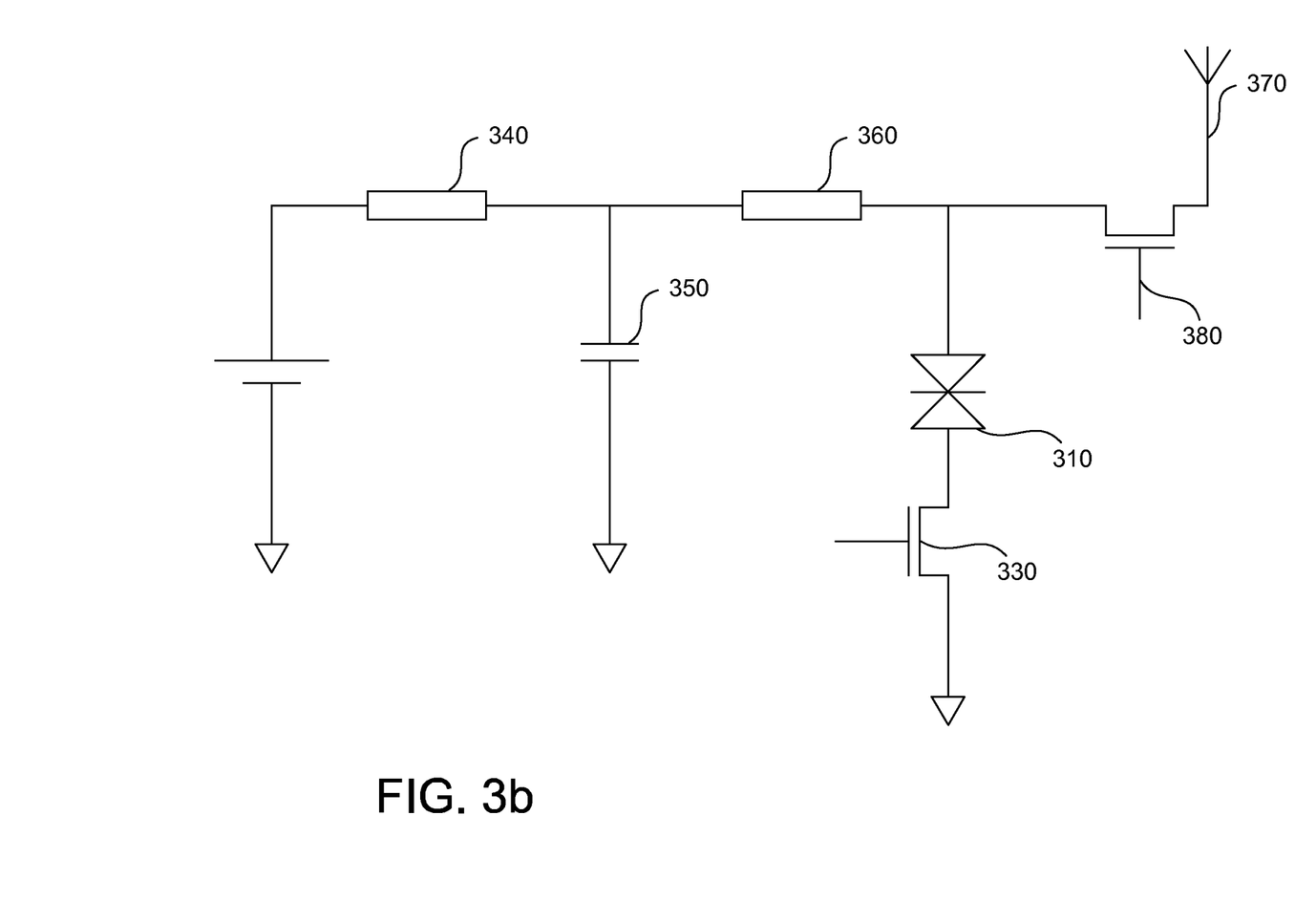

An alternative embodiment is disclosed in FIG. 3b, where a variable resistance 330 is placed in series with the RTD 310. As disclosed in relation to FIG. 2, the variable resistance operates as to increase the total resistive loss in the oscillation circuit and to shift the bias of the RTD 310 such that any oscillations induced in the tank circuit will decay. The greater value the variable resistance 330 is given the quicker decay of any oscillations present in the tank circuit.

Figure 3C:
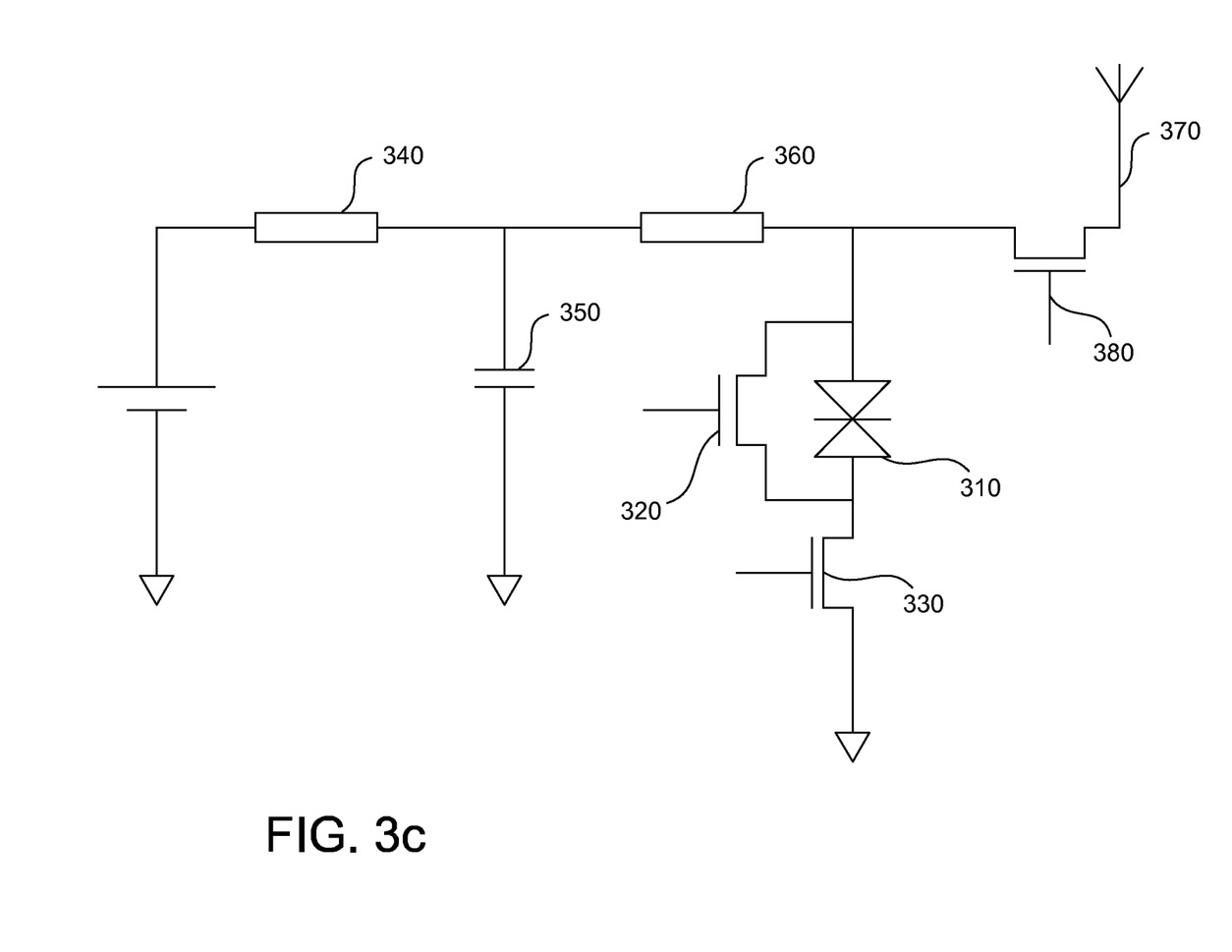

In yet an alternative embodiment disclosed in FIG. 3c, both a parallel variable resistor 320 and a series variable resistor 330 are employed in the circuit. By providing both variable resistances 320, 330 with a baseband trigger signal the oscillator may be turned on and off very quickly due to the shift in bias of the RTD 310 by means of variable resistances 320, 330 as well as the increase in circuit losses by means of the variable resistances 320, 330.

Each of the variable resistances 320, 330 can be implemented by means of a transistor in triode region. The transistor technology used for the variable resistances 320, 330 can e.g. be heterostructure bipolar transistor (HBT), high electron mobility transistor (HEMT) or metal-oxide-semiconductor field-effect transistor (MOSFET). The transistors may be implemented in III-V or Si-based material systems, including InP/InGaAs with combinations of high-k materials for gate isolation. The variable resistances 320, 330 can also be implemented using a mechanical switch, using micro-electro-mechanical systems (MEMS) or nano-electro-mechanical systems (NEMS) technology. Alternatively the variable resistances 320,330 may be implemented by means of a PIN diode.

The variable resistances 320, 330 are preferably integrated on the same chip as the RTD 310. This enables a higher switching frequency of the resistances 320, 330 i.a. due to an increased control of stray capacitances. This in turn enables the duration of the short pulses (wavelets) to be reduced and the transition between the oscillating and non-oscillating state of the tank circuit to be more well defined. It further simplifies processing as the RTD and transistor can be grown in the same epitaxial stack.

The implementation losses 340 may alter from different methods of integration but the losses can be generalized as a combination of inductive and resistive elements. As mentioned above, if the components of the transceiver are integrated on a single chip, the main contribution to the implementation loss 340 arises from the bonding of the wires to the chip.

In order to decouple the supply voltage provided to the transceiver, a decoupling capacitor 350 may be implemented on-chip e.g. in the form of a metal-insulator-metal capacitor, preferably in the range of 200 pF to 10 nF. The decoupling capacitor 350 stabilizes the circuit voltage and acts as a high-frequency short circuit for the oscillator.

The inductive element 360 may be implemented in the form of a coplanar waveguide (CPW). The inductive element 360 forms part of the tank circuit 240 in FIG. 2 together with the capacitances (i.a. the inherent capacitance present in the RTD) in parallel with the inductive element 360. The circuit oscillates at its resonance frequency when the RTD 310 is biased in its region 120 with negative differential conductance.

The antenna 370 may in one embodiment be based on a chip antenna, a dielectric resonator antenna (DRA), where a radiating dielectric block is cut out from a semiconductor substrate. The block is designed to have non-confined radiating modes of electric field at the resonance frequency of the oscillator. In one embodiment the chip on which the components of the transceiver are integrated also acts as antenna, i.e. instead of integrating the components on one chip and using a separate chip for the antenna, the same chip may be used in order to obtain a very compact design. Alternative forms of antennas are equally possible such as; on-chip dipole antennas, on chip slot antennas, and off-chip patch antennas. The antenna 370 may be used as an inductive load, which makes the antenna a part of the tank circuit thereby affecting the resonance frequency of oscillator. If the antenna is used as inductive load for the tank circuit, the variable resistance 320 will act as to quickly damp oscillations in the antenna when operated in a low-resistance mode. The same applies to the variable resistance 330 when operated in a high-resistance mode. In this context, low resistance means that the resistance of the variable resistance is lower, preferably more than ten times, than the absolute value of the resistance of the RTD, and high resistance means that the resistance of the variable resistance is higher, preferably more than ten times, than the absolute value of the resistance of the RTD.

In one embodiment the electrical circuit may be implemented as a part of a dielectric block. This makes it possible to fabricate simple transceivers for radio frequency wavelets. The combined implementation of a wavelet generator together with integrated dielectric resonator antenna, on-chip decoupling capacitor and the optional isolation and gain stage produce a complete transceiver for impulse radio signals, ready to be integrated with other systems, such as digital CMOS electronics.

The isolation and gain stage 380 is optional and may be used during the transmission mode to amplify the generated wavelet before delivered to the antenna 370. As mentioned above, even though the isolation and gain stage 380 is illustrated as a MOSFET transistor in FIG. 3, it is possible to include a power amplifier in this stage. As indicated in FIG. 3 the isolation and gain stage 380 may be implemented as a switchable transistor, such as a MOSFET, which can be switched between a common-gate low noise amplifier (receiver mode) and a short-circuited switch (transmit mode), depending on the transceiver's mode of operation. As disclosed above, the isolation and gain stage may alternatively include a power amplifier used for amplifying the signal to be provided to the antenna when the transceiver is used as a transmitter.

Figure 4:
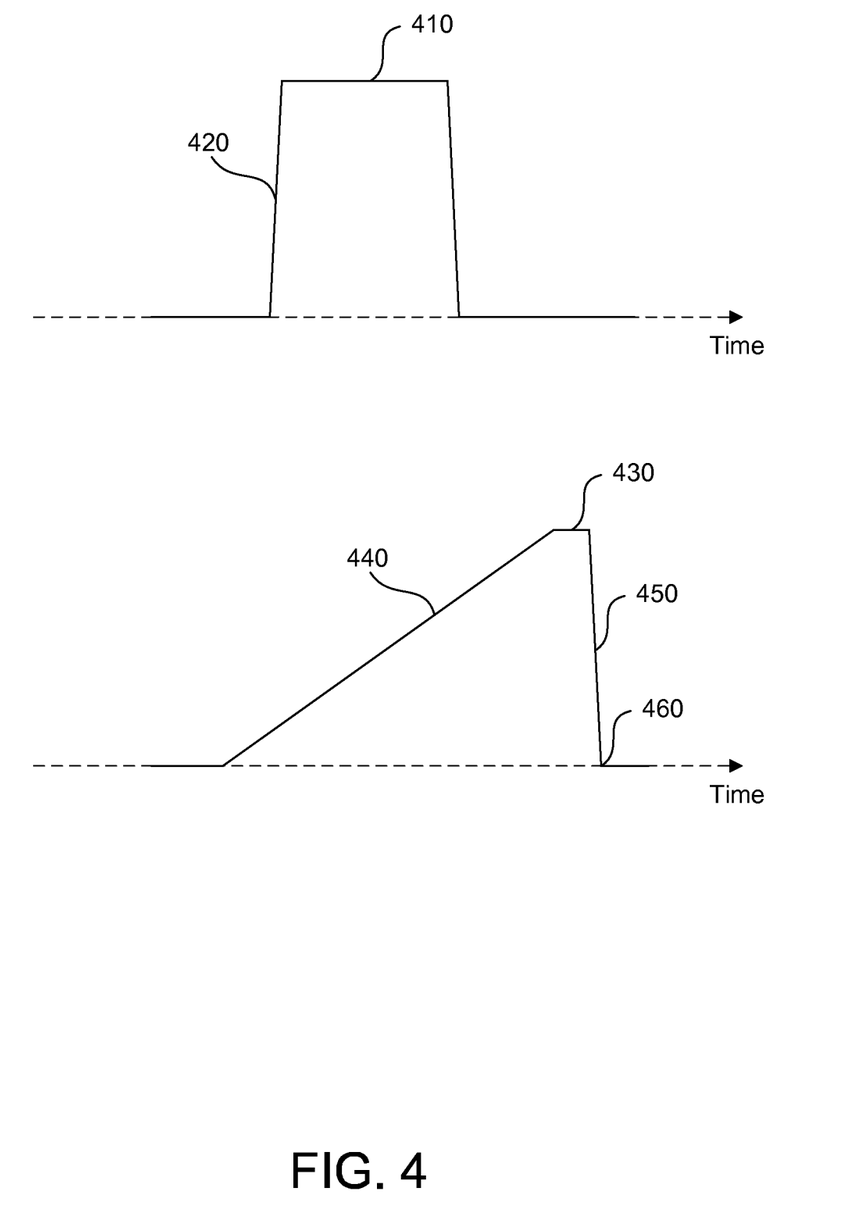
FIG. 4 are examples of baseband trigger signals used for controlling the NDC according to a first embodiment.

In a preferred embodiment the same circuit topology can be used as both transmitter and receiver. Referring to FIG. 4, operating as a transmitter, a fast transition baseband trigger signal 410 (i.e. a signal with high slew rate 420 compared to the length of the baseband pulse length) turns on the oscillator with sub-period turn-on time. The oscillator amplitude is rapidly increased in response to the application of the baseband trigger signal 410 due to the transition of the circuit into an unstable state (negative loop resistance) and the rapid change in the current flowing through the tank circuit (due to the switching of the variable resistances 320, 330).

For receiver operation, a slow transition of the baseband trigger signal 430 is used, wherein the oscillator functions as a super-regenerative oscillator. The oscillation amplitude builds up from the received wavelet signal power and noise power during a slow transition 440 of the baseband trigger signal 430. After oscillation is established, it is quenched 450 and a new cycle may start. In this manner, a time window for reception may be formed, during which the receiver is extremely sensitive to signals of the same frequency as the oscillation frequency of the receiver. The time window may be controlled by the slew rate 440 of the baseband trigger signal. After the time window is closed 460, a short recovery period is required until a new reception cycle may be initiated.

When used as a receiver, the voltage amplitude of the envelope of the super-regenerative oscillator is measured by an energy detector (denoted 270 in FIG. 2), which output voltage is provided as an output envelope signal. The influence of the energy detector on the oscillator is considered negligible due to its high impedance at the resonance frequency.

In an alternative embodiment, the transceiver is configured to only operate as a transmitter, wherein a separate receiver (e.g. a transceiver of the same type as above configured to operate as a receiver, or another receiver with high bandwidth and high sampling rate) is used for receiving the transmitted signals.

Figure 5:
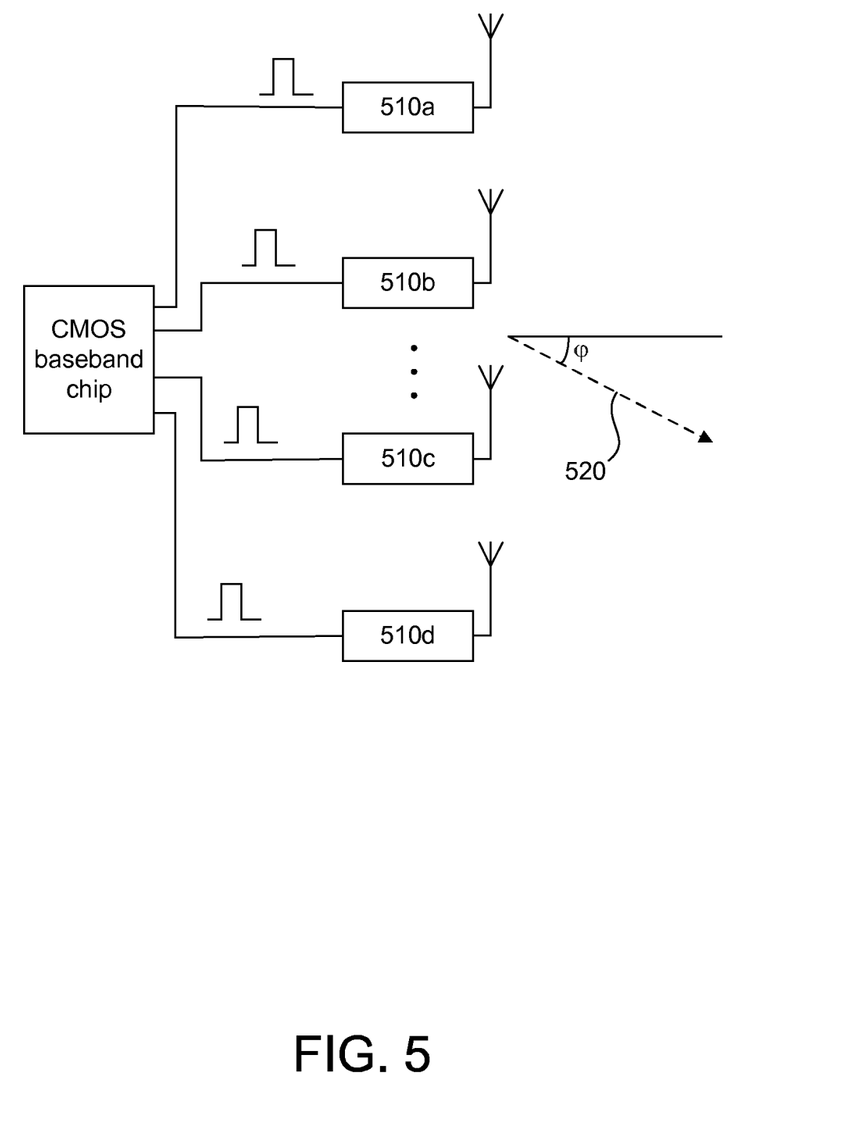
FIG. 5 is a schematic block diagram of a group of transceivers used for controlling a radiation pattern according to an alternative embodiment.

In one embodiment, shown in FIG. 5, a set (e.g. 2 to 100) of transceivers 510a-d according to the above may be used to control the radiation pattern of the emitted wavelet from the array configuration of antennas. Firstly, this enables a control of the angle of transmission. The angle φ of the main beam from an array of transceivers 510a-d can be controlled by digitally controlling the delays of the different baseband trigger signals in transmit mode, as shown by the inclined dotted line 520 in FIG. 5. Secondly, in receiver mode, the angle of arrival may be digitally set by delaying the different baseband trigger signals of an array of transceivers 510a-d. This increases the overall receiver sensitivity by causing a directional dependent sensitivity. Thirdly, by sequentially sampling an array of transceivers 510a-d, the receiver sampling frequency can be increased by a multiplication of the number of transceivers 510a-d. The receiver has a recovery time between each receiver sequence. By using several receivers in parallel, which are sampled in sequence, the recovery time can be reduced.

Figure 6:
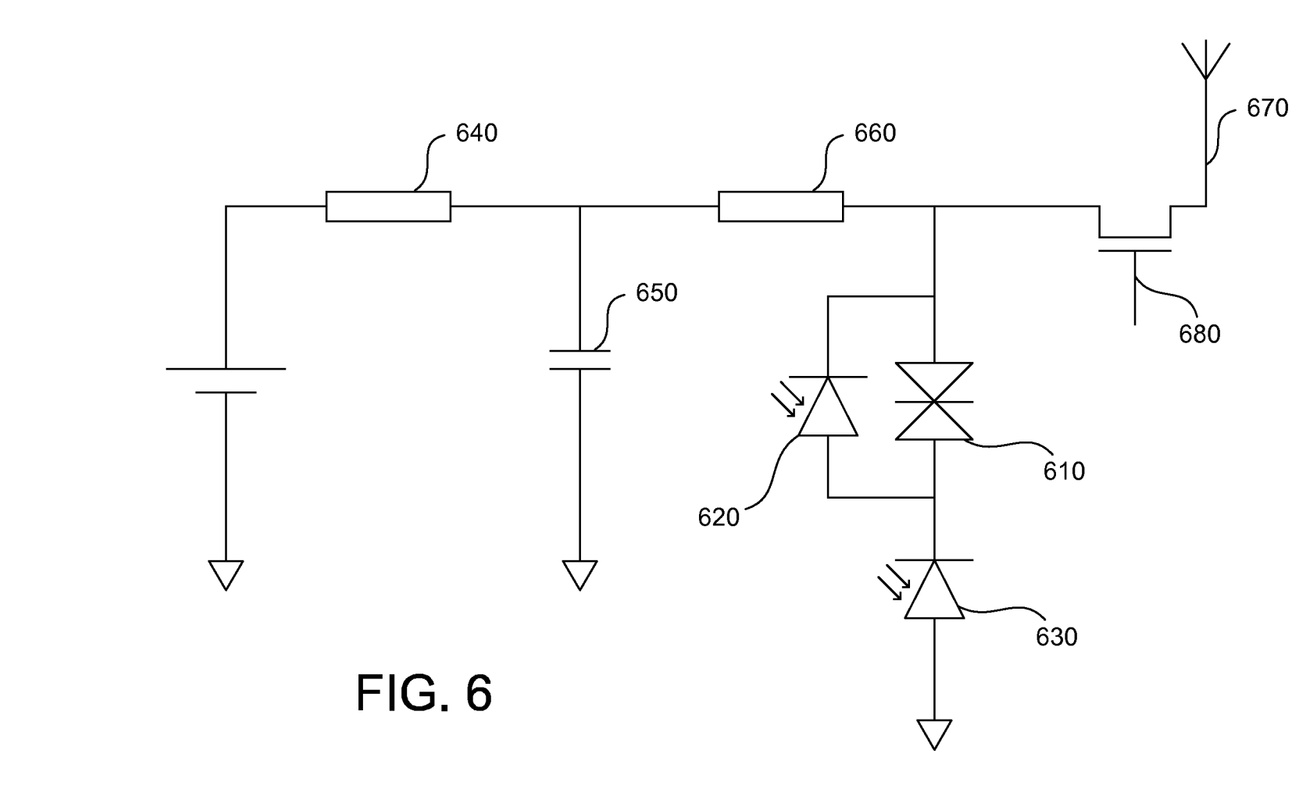
FIG. 6 is a schematic circuit diagram of a transceiver according to a second embodiment.

FIG. 6 illustrates an alternative embodiment of the present invention. In the figure items 610 and 640-680 correspond to items 310 and 340-380, respectively, disclosed in detail in relation to FIGS. 3a-3c.

Starting out from FIG. 3c the MOSFET transistors 320, 330 has in FIG. 6 been replaced by a pair of photodetectors 620, 630. However, it is stressed that the disclosure below could equally start out from FIG. 3a or 3b wherein only one photodetector is present in the circuit, In FIG. 6 the photodetectors are illustrated in the form of a pair of photodiodes, but other photodetectors, such as phototransistors, which act like amplifying photodiodes, photoresistors which change resistance according to light intensity, phototubes containing a photocathode which emits electrons when illuminated, such that the tube conducts a current proportional to the light intensity, or reverse-biased LEDs acting as photodiodes are possible to implement in the circuit.

The photodiodes 620, 630 are preferably used in photoconductive mode, wherein the photodiodes 620, 630 are reverse biased, The reverse bias reduces the response time of the photodiodes 620, 630 due to a decrease in the junction's capacitance caused by an increase in the width of the depletion layer of the photodiodes 620, 630.

The photodiodes 620, 630 are formed by a PN junction or PIN structure. When a photon of sufficient energy strikes any of the photodiodes 620, 630, it excites an electron, thereby creating a free electron (and a positively charged electron hole). A photocurrent is produced when the hole, accelerated by the electrical field in the junction, moves toward the anode and the electron moves toward the cathode. The magnitude of the photocurrent determines the current through the RTD 610 (and hence the biasing of the RTD 610). By applying short light pulses on the photodetectors the circuit may be shifted between the oscillating and non-oscillating state.

The bandgap of the material used for producing the photodiodes 620, 630 defines the operating wavelength of the photodiodes 620, 630. Suitable materials for producing the photodiodes 620, 630 include Silicon (approximately 190-1100 nm), Germanium (approximately 400-1700 nm) and Indium gallium arsenide (approximately 800-2600 nm).

Irrespective of the specific component to use as photodetector 620, 630, the short light pulses used for controlling the photodetectors 620, 630 are provided to the circuit by means of light guides such optofibres or the like.

The transceiver described above may be used for short-range high-speed communication. The transmitted wavelets may be modulated with amplitude, position, frequency, phase, or a combination of them by the baseband trigger signal.

The transceiver may be used in radar and imaging applications, by measuring the time-of-arrival. It is possible to attain detailed information about the channel by using the transceiver as a transmitter in a system with a high-sampling-rate receiver.

The wavelet generated by the transceiver may be used as probing signal in a spectroscopy system. Since the generated wavelet may be extremely short (sub 100 ps), the signal bandwidth may be extraordinary wide. This may result in a pulsed-wideband system for spectroscopy at the low THz frequency band (50 GHz-300 GHz).

The transceiver described above may be used for localization in a short-range wireless network comprising several transceivers by triangulation. Since the generated wavelets can be very short, the expected accuracy will be high for such a system.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. A transceiver comprising:
   a tank circuit,
   a variable differential conductance (VDC) coupled to the tank circuit, and
   a variable resistance coupled in series with the VDC, and arranged to bias the VDC into a region of positive differential conductance during a first state of operation of the transceiver, and bias the VDC into a region of negative differential conductance during a second state of operation of the transceiver,
   wherein the VDC is coupled to the tank circuit such that the positive differential conductance of the VDC during the first state of operation of the transceiver prevents the tank circuit from oscillating, and the negative differential conductance of the VDC during the second state of operation of the transceiver allows the tank circuit to oscillate, and
   wherein the variable resistance is adapted to be controlled by an electrical trigger signal with a first slew rate for operating the transceiver in transmitter mode, and adapted to be controlled by an electrical trigger signal with a second, lower slew rate for operating the transceiver in receiver mode.

2. The transceiver according to claim 1, wherein the VDC is implemented in by means of a resonant tunneling diode (RTD).

3. The transceiver according to claim 1, wherein the variable resistance, the VDC and the tank circuit are integrated on a single chip.

4. The transceiver according to claim 1, wherein the variable resistance is formed by a transistor with an isolated gate, such as a MOSFET.

5. The transceiver according to claim 1, wherein the variable resistance is formed by a photodetector, such as a photodiode.

6. The transceiver according to claim 1, comprising a second variable resistance coupled in parallel to the VDC and arranged to shunt current from the VDC in the first state of operation.

7. A method of operating a transceiver including a tank circuit and a variable differential conductance (VDC) coupled to the tank circuit, said method comprising:
- biasing the VDC into a region of positive differential conductance during a first state of operation of the transceiver such that the tank circuit is prevented from oscillating;
- biasing the VDC into a region of negative differential conductance during a second state of operation of the transceiver such that the tank circuit is allowed to oscillate by means of a variable resistance coupled in series with the VDC in order to limit the current flowing through the VDC in the first state of operation; and
- controlling the variable resistance by an electrical trigger signal with a first slew rate for operating the transceiver in transmitter mode, and controlling the variable resistance by an electrical trigger signal with a second, lower slew rate for operating the transceiver in receiver mode.

8. The method according to claim 7, wherein the VDC is implemented by means of a resonant tunneling diode (RTD).

9. The method according to claim 8, comprising shunting current from the VDC in the first state of operation by means of a second variable resistance coupled in parallel to the VDC.

10. The method according to claim 7, comprising shunting current from the VDC in the first state of operation by means of a second variable resistance coupled in parallel to the VDC.

11. The transceiver according to claim 2, wherein the variable resistance, the VDC and the tank circuit are integrated on a single chip.

12. The transceiver according to claim 2, wherein the variable resistance is formed by a transistor with an isolated gate, such as a MOSFET.

13. The transceiver according claim 2, wherein the variable resistance is formed by a photodetector, such as a photodiode.

14. The transceiver according to claim 2, comprising a second variable resistance coupled in parallel to the VDC and arranged to shunt current from the VDC in the first state of operation.

* * * * *